United States Patent [19]

Sandys

[11] Patent Number: 4,807,562
[45] Date of Patent: Feb. 28, 1989

[54] REACTOR FOR HEATING SEMICONDUCTOR SUBSTRATES

[76] Inventor: Norman Sandys, 16 Crescent Dr., Searingtown, N.Y.

[21] Appl. No.: 306

[22] Filed: Jan. 5, 1987

[51] Int. Cl.[4] .............................................. C23C 16/00
[52] U.S. Cl. .................................. 118/725; 118/715; 118/728; 118/730
[58] Field of Search ................ 118/728, 730, 715, 725

[56] References Cited

U.S. PATENT DOCUMENTS

| 4,446,817 | 5/1984 | Crawley | 118/730 |
| 4,579,080 | 4/1986 | Martin | 118/730 |

Primary Examiner—Richard Bueker
Attorney, Agent, or Firm—Connolly & Hutz

[57] ABSTRACT

A chemical vapor deposition (CVD) reactor includes a vertically mounted multi-sided susceptor with means to adjust the gas flow across the width of each susceptor face. Gas can be fed thru the inside of the susceptor to various distribution devices positioned inside or above the susceptor. A pyrolytic graphite heat shield inside the susceptor insulates against overheating the input gases. Susceptors with various shaped sections form gas flow channels for each face of the susceptor. Reflective reactor tube coatings are used to conserve energy and to minimize crystal slip.

50 Claims, 4 Drawing Sheets

REACTOR FOR HEATING SEMICONDUCTOR SUBSTRATES

BACKGROUND OF THE INVENTION

The invention is particularly directed to a reactor for the production of epitaxial layers on large semi-conducting wafers. There are shortcomings that exist with the commercially available reactors such as discussed in Thin-film polycrystalline Photovoltaic P. 43-83. Final report January 1982, SER/TR-0-9100. Of the four reactor designs, the barrel and pancake reactors are currently favored for the production of epitaxial layers. Of these two designs, the barrel reactor is the most popular for its higher capacity of nominally large wafers, its clean environment and its capability to produce nearly slip free wafers. The present designs of horizontal, barrel and pancake reactors have evolved as scale-ups of previous designs that had nominally large capacities of small wafers, e.g., U.S. Pat. Nos. 3,424,629 and 3,699,298; the reactor capacities were between 30 and 60 wafers of 1.25 inches in diameter; this is equivalent to a maximum processed area of 74 in$^2$. In contrast, the largest commercial reactor currently available, which is the AMI barrel (Table 1), can hold 24 wafers of 4 inches in diameter; this is equivalent to 302 in$^2$ of processed area. The realistic epitaxial typical layer thickness tolerances for the barrel reactors are between ±5% to ±6%. In general, for a given reactor tube diameter, the tolerance increases as larger diameter wafers are fitted into the reactor. In general, conventional barrel reactors produce a thicker deposit on the side edges of the wafers as compared to the center. In some cases the thinnest deposit is between the center and the edges of the wafer. The theoretical reason is that as the wafer diameter increases, the ratio of the distance from the center of the wafer surface to the interior of the round reactor tube wall and the corresponding distance from the side edges of the wafer surface to the tube wall become more unequal. Hence, the mass transport diffusion distance from the gas stream to the side edges of the wafer surfacer is shorter than it is at the center. The result is a thicker epitaxial deposit at the edges than at the center. In order to reduce this problem, the reactor tube diameter should be increased as the wafer size is increased. Although larger barrel reactors, with capacities of up to 21 wafers of 6 inch diameter, are in the development stage, the anticipated purchase cost is in excess of $1,000,000 per unit. Also, since the expense of operating large barrel reactors increases rapidly with size, and in general, the reliability decreases rapidly with size, the economics of such a system are questionable.

The Pancake reactor systems, in general, operate more reliably but are more difficult to scale up for large wafers. Such systems are capable of producing epitaxial layer thickness tolerances of ±3%. Since gases are recirculated over the product wafers, and since the induction heating coil is mounted inside the reactor tube, the integrity of the gas ambient with respect to total amount of impurities is not as good as a barrel. Also, it is more difficult to grow slip free epitaxial layers in a pancake reactor because it is more difficult to reflect radiant heat energy onto the front surfaces of the wafers. Nevertheless because of high reliability and tight tolerances, pancake reactors are a popular choice where product specifications can tolerate the drawbacks.

With reference to Table 1 and the previous discussion, it should be evident that the bottleneck for producing epitaxial layers on large wafers is the designs of present CVD reactors and their cost verses thru put. Current crystal growth technology can produce high quality 8 inch diameter wafers. Since the history of semiconductor processing has shown that overall economics are in favor of handling the largest wafers possible, the industry would like to process the 6 to 8 inch diameter wafers that are now available. At present, a cost effective and reliable barrel or pancake reactor that can process these wafers cannot be envisioned.

Metal organic chemical vapor deposition (MOCVD) of III-V compounds is taking the path of silicon epitaxial reactor development for the growth of III-V compound layers on III-V or silicon substrates. Also, the barrel reactor geometry is used for gas plasma etching apparatus. Any improvements made in distributing gases in barrel reactor could possibly be used for such systems. Also, there is the possibility of barrel type plasma deposition systems.

SUMMARY OF THE INVENTION

An object of this invention is to provide a comparatively inexpensive CVD reactor designed to overcome the shortcomings of the previously mentioned reactors.

The reactor of this invention, as disclosed herein, is designed specifically for a nominal capacity of 6 or 8 inch diameter wafers. Significant gains in thru put can be obtained by multiplexing a number of such reactors with common power supplier and gas delivery systems. Since the reactor stations are of simple construction and inexpensive, extra stations can be designed into the integrated multiplexed system in such a way that they may be automatically loaded and purged in a standby mode. Then, when power and reactive gases are available from the central supplies, they switch on automatically for heat up and epitaxial deposition. In this way, the integrated system can always operate at high capacity, even when maintenance is required on separate reactor stations. With the use of low frequency induction heating, it is not uncommon to operate 4 to 6 stations simultaneously from large power supply. In this way, significant energy economics are gained by using large power supplies Typically, large 10 Khz power supplies of the type required for the integrated systems are 80% efficient, in contrast, the high frequency power supplies that would be required for individual reactors would be 50% or less. Also, low frequency power supplies can be remotely located outside of the expensive clean room areas that are required for epitaxial reactors.

THE DRAWINGS

DETAILED DESCRIPTION

The present invention in general relates to a barrel reactor 10 with a non-rotating four sided susceptor 12. The susceptor 12 is heated by a conventional induction heating coil which is not shown. This system, as differentiated from a conventional barrel reactor, achieves deposition uniformity on its four susceptor faces without rotation; the inventive arrangement allows the deposition conditions on the four sides to be separately controlled within the range required for the desire deposition uniformity. The non-rotating susceptor 12 also allow the use of desirable geometrical relationships between the susceptor faces and the reactor tube wall that are similar to conventional horizontal reactors. In this way, a more desirable deposition thickness uniformity can be achieved from the edges to center of large wafers. Since the reactor is basically four separate horizontal reactors turned on end and housing in on reactor tube, the theory and past experience with horizontal reactors has been used to predict the performance of this novel reactor. The reactor as shown in FIGS. 1-5 has been designed for 12 wafers of 6 inches in diameter. The arrangement of 3 wafers per side on a four sided susceptor is approximately equal to four 2 inch by 6 inch horizontal reactors with an active susceptor length of less than or equal to 18 inches inclined at a angle between 2 and 4 degrees from the vertical. The active susceptor length refers to the portion of the susceptor that is covered by product wafers. Typical horizontal reactors of this size allow good deposition uniformity within the desired tolerances at nominal mainstream flow rates of 70 to 100 liters per minute of hydrogen gas-depending on level of growth rate, pre-heater length, susceptor angle, temperature level and profile and type of reactive chemicals.

Figure 3:
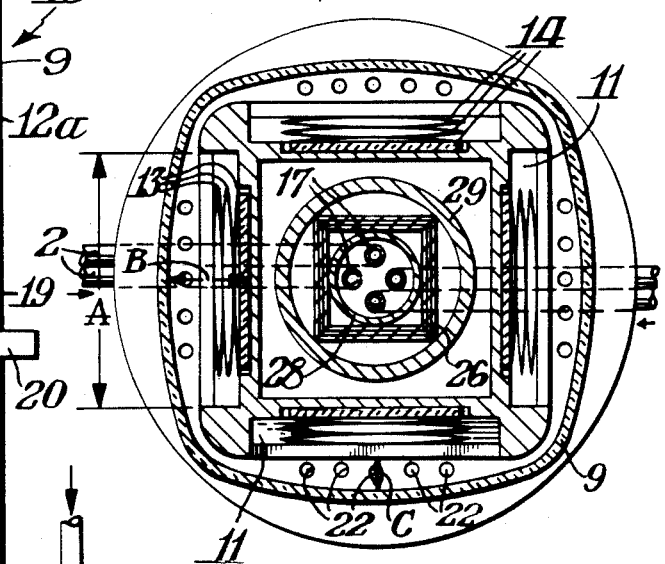
Figure 4:
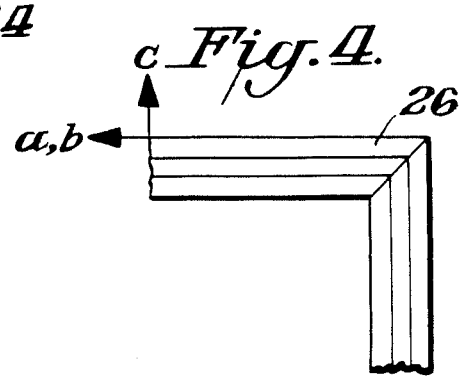
FIG. 4 is a plan view showing a portion of the reactor corner section.
Figure 5:
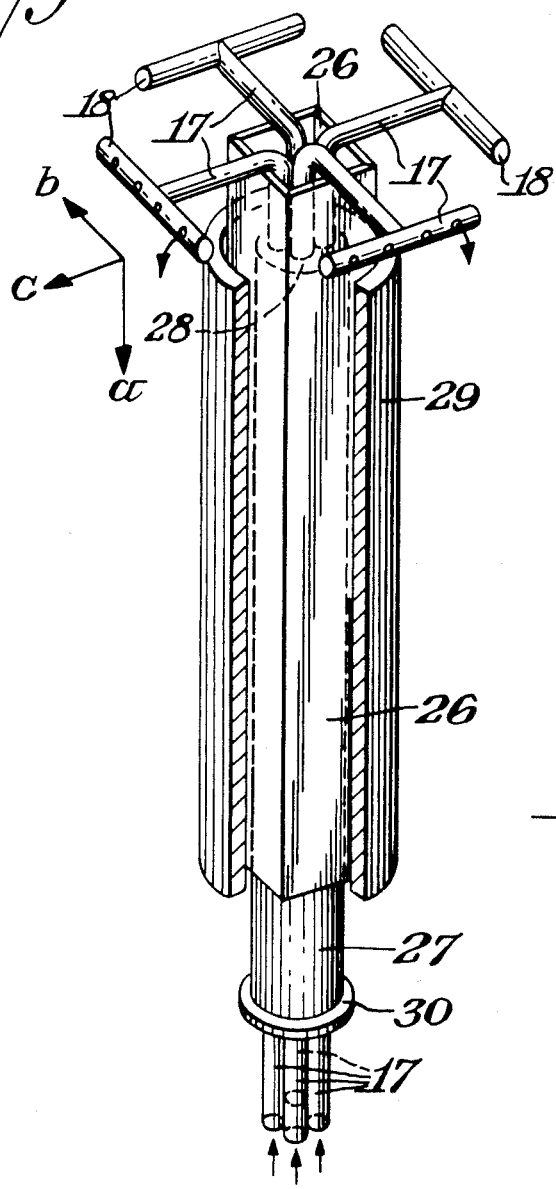
FIG. 5 is a perspective view of the gas input distributor system housed inside the reactor of FIG. 1.

FIGS. 1-5 illustrate one form of reactor in accordance with this invention. As illustrated, reactor 10 is of the barrel type. A solid hollow truncated pyramidal susceptor 12 has a pre-heater 15 and a post heater support 19 housed in a quartz reactor tube 9. It should be noted that the flat planar non-ribbed surfaces of the pre and post heaters can be truncate pyramidal, but preferably they should be straight. The quartz tube or body 9 is sealed to the upper side of base plate 20 in a convenient manner, not shown, so as to allow product wafers 14 to be mounted and unmounted from the susceptor 12 during the time between deposition cycles. Additional non-electrically conducting support members, that are normally required between post-heater 19 and base plate 20 are not shown. Details of sealing and opening the reactor 10 and flanges associated with tube 9 and base plate 20 are not shown. The gases enter through four separate controllable valves 34 which are attached to feed-thru type of fittings 2 in lower metal portion of reactor 21. The gases then flow through flexible, bellows type, metal tube 32 which are attached to the lower tubular termination 17 of the gas input distributor 24. The distributor 24 has a disc 30 for support brackets which are not shown. The gas input distributor 24 within susceptor 12 is shown in abbreviated form in FIG. 1 with additional details shown in FIG. 5. The input gas then flows up the four tubes 17 which are housed together in tube or sleeve 27 with alignment plate 28 to their top bent sections and exit are the top of the pre-heater 15 into space 11. The cross tee shaped tubular sections or nozzles 18 with exit holes shown in FIG. 5 are omitted from FIG. 1. It should be noted that the size of the gas input hoses, their spacing, and their direction can be made in varied combinations to suit various deposition conditions. The reactor can be operated, depending on the product specification, with or without the input distributor tubes 18. In reference to FIG. 1, as the gas enters the space 11 between buttress corners 12a, it is confined and deflected downward by the hollow cap 16. The gas then flows downward along the inclined susceptor sides in a parallel relationship to the surface of wafers 14 and the gas exits the main portion of the reactor chamber through exhaust holes 22. It should be noted that the size and spacing of the gas exhaust holes can be varied to suit various deposition conditions. The wafers 14 are mounted in conventional recesses 13 in susceptor 12. The exhaust gas passes through holes 22 and flows through ducts, not shown, to the end of exhaust tubes 36. As the gases flow past the wafers 14, epitaxial deposition takes place on the wafers 14 in the usual manner.

So far the reactor has been discussed in a general way so as to enable one skilled in the art to understand the relationship that exists between its operational components. But, in fact, it is the novel way that these components are designed that allows them to be used in the previously described manner to form a practical reactor. Normally, reactive gases are not introduced into a reactor chamber of this type by way of being piped through tubes which pass through a hot susceptor. The reason is that many of the reactive chemicals, used for CVD deposition, would heat up and cause pyrolytic deposition in the tubes. In the worst case, the tubes 17 would plug; if they did not plug, unwanted particulate matter would be blown onto the wafers 14 and cause poor epitaxial deposits. In any case, pyrolytic deposition inside the tubular pipes 17 would severely deplete the amount of chemicals available for epitaxial deposits on the wafers 14. The pyrolytic graphite heat shields 26 are arranged in a box-like structure around the gas input distributor assembly 24 within tube 29 in a manner that keeps the tubes 17 sufficiently cool enough to avoid unwanted pyrolytic deposition. The anisotropic thermal insulating properties of shield 26 with respect to it "a, b" and "c" axis orientation are well known, as disclosed in U.S. Pat. Nos. 3,980,854 and 4,099,041. As shown in FIGS. 4-5 the "c" axis orientation of shield 26 is in the direction that substantially reduces the heat flow from the hot susceptor 12 to the gas delivery tubes 17. Normally, in CVD reactors of this type, unwanted deposition on the interior of the reactor tub wall 9 is suppressed by copious amounts of either air or water cooling on the exterior of the reactor tube. Also, for large barrel reactors, nominally large gaps between the hot susceptor 12 and the tube wall 9 are required to avoid over-heating the tube wall. Typically such gaps are a minimum of 1.0 centimeters. For this reactor, a relatively small gap, 0.5 centimeters, which is typical for horizontal reactors, can be used. This is important in order to minimize the amount of carrier gas require for uniform CVD deposition over the active length of the susceptor and to minimize the cross flow of gases between the adjacent faces of the susceptor 12. There are two primary reasons why such a small gap can be used with this reactor. First, the susceptor, as in a horizontal reactor, is not rotated. This mean that fresh reactive gases are not swept into the close space gap. Since the gap is small and has a high impedance to the high viscosity cross flow of hot gases, the reactive gases with the large diffusion coefficient would preferably deposit on the susceptor 12 and wafers 14 if the reactor tube is kept nominal cool. The second, and most important reason, is that the reactor tube wall 9 temperature can be made low enough by the unique induction heating characteristics of the susceptor 12. The buttress corner end sections 12a of susceptor 12 are important the reactor design for two reasons. First, they form the desired four individual gas flow channels that allow the reactor to be operated, from a chemical mass transport point of view, as four separate horizontal type reactors, and second they provide a low resistance electrical path in series with the high resistance section behind the wafers. Hence, the corners 12a of the susceptor, which are closer to the reactor tube wall 9, can be made much cooler than the wafers 14 at normal CVD operating temperatures. This result is similar to the effect shown by U.S. Pat. No. 4,099,041.

Figure 5A:
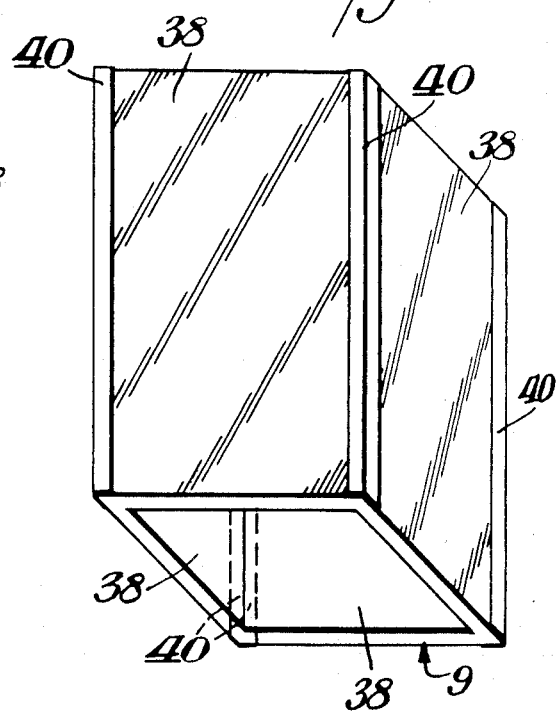
FIGS. 5A and 5B are perspective views of alternative reactor tubes.
Figure 5B:
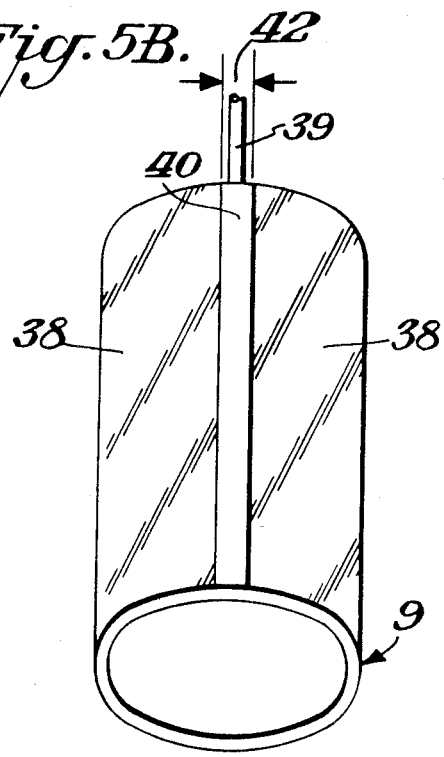

Another way that the reactor tube wall opposite the stationary susceptor corners can be made cool is shown in FIG. 5A. A reflective coating 38 is applied to the outside of the reactor tube 9 everywhere except the vertical portions 40 which would be opposite of the corners of the susceptor. In this way, the coating 38 would mostly reflect heat back onto the front surfaces of the product wafers. This helps alleviate the problem with crystal structure slip in the product wafers. See, for example, U.S. Pat. Nos. 3,665,139 and 4,284,867. The vertical portions 40 also serve another purpose since the thin reflective coatings are normally good electrical conductors, e.g. silver or gold, they couple to some extent with the R.F.. energy. By interrupting the continuous electrical path in the coatings 38 over its entire length with the vertical areas 40 the induced R.F. coupling in the coating is reduced. FIG. 5B shows the reflective coating configuration for a rotating susceptor in a round reactor tube. The split uncoated area 40 extends the entire length of the coating 38 and its width 42 is chosen sufficiently small so as not to interfere with the process, but sufficiently large so as to be able to view the product wafers and make optical temperature measurements thereof. FIG. 5B also shows typical gas inlet tube 39 connected to the spherical top of the conventional round reactor tube.

Figure 1:
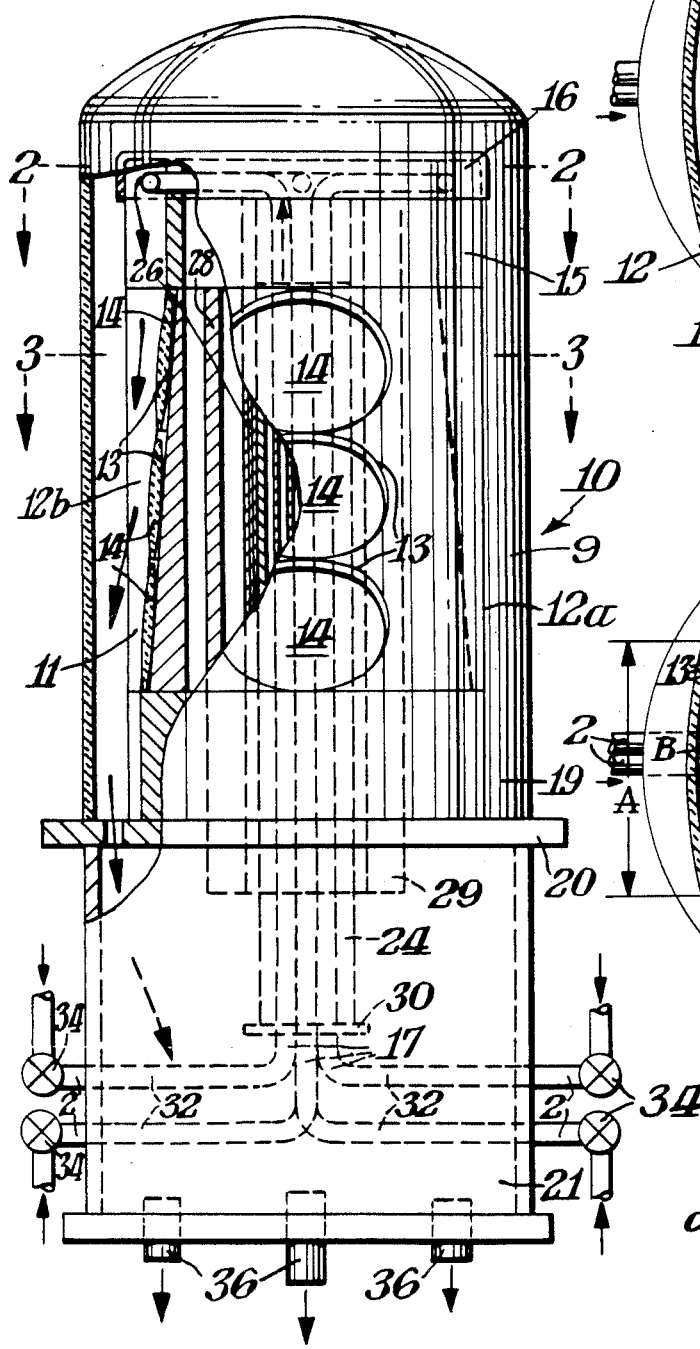
FIG. 1 is a side view partly in section of a reactor in accordance with this invention.
Figure 2:
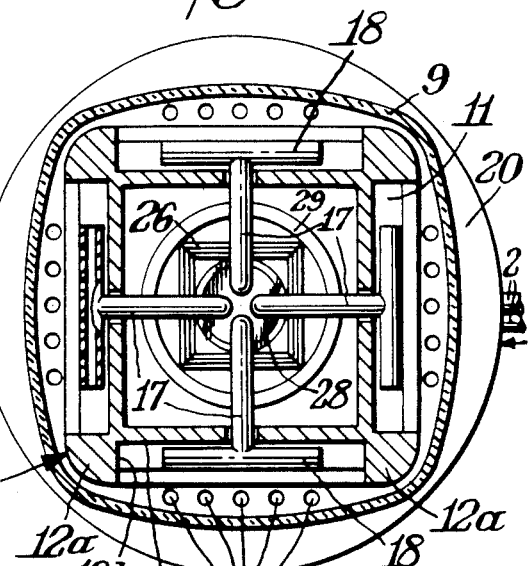
FIGS. 2-3 are cross-sectional views taken through FIG. 1 along the lines 2—2 and 3—3, respectively.

The size and shape of the gas flow channels as shown in FIGS. 1-3, are important. The gas flow in FIG. 3 enters the top of each susceptor side normal to the plane of the paper through a cross-sectional area approximately equal to the dimensions of A multiplied by B. The gas then is guided across the wafers and exits past the bottom of the susceptor through an area of approximately A multiplied by C. The area is approximate because the reactor tube 9 is shown with slightly curved surfaces. Although round or square cross section reactor tubes can be used with this reactor configuration, slightly curved surfaces are preferred. The curvature decreases the mass transport diffusion path at the edges of the wafer as compared to the center. As previously noted, an undesirable non-uniformity is produced by this effect in conventional barrel reactors for deposition on large wafers. With reactor 10, the effect compensates for the decreased mass transport to the edges of the wafers due to their close proximity to the corners that form the buttress type protrusions 12a. There are two reasons: (1) there is in creased hydrodynamic drag at the junction of the corner forming surfaces 12b and 12c; (2) there is enhanced depletion of chemicals from the gas because of some deposition at this junction on the corner surface 12b. This is due to some heat conduction from the adjacent surface. Also, it should be noted that the sufficiently curved surfaces give the reactor tube strength for low pressure CVD operation. As should be apparent from previous discussion, this novel CVD reactor configuration is a flexible design for uniform epitaxial layers on large diameter wafers. In addition to those mechanical components that have been mentioned the number of holes, their size, spacing and direction can be varied in the gas input distributor tubes 18 and exhaust 22. Once a configuration of all the parameters is selected for a wafer size and uniformity tolerance, the difference in deposition rate between the four stationary susceptor sides will only depend on fabrication tolerances of the components. These differences can be compensated by in-putting slightly more or less carrier and doping gasses per susceptor side through the control valves which individually control the gas to each susceptor face. Normally such test runs are made on all barrel, pancake and horizontal reactors when they are set up or components are changed. Although this new reactor concept has been described as a four-sided stationary reactor, it should be evident, to those skilled in the art, that there is a great deal of freedom in the design relationships between its components. For example, it was emphasized that the susceptor with buttress type corners helps to overcome thickness non-uniformities on large wafers in curve reactor tubes. Also, it provides the desired characteristics for induction heating. Therefore, this design could be used for rotating susceptors of four sides or more in conventional barrel systems with round reactor tubes. Also, the gas input distributor system could be used for conventional barrel reactor design.

The following Table I compares reactor capabilities of an AMI reactor which costs $500,000 to $750,000 in 1984 with a pancake-flat round reactor costing $500,000 and with reactor 10 of this invention.

TABLE I

| Faces | # of wafers | Wafer dia. inches | # of wafer | Processed area in$^2$ |
|---|---|---|---|---|
| A. AMI reactor capacity (12 inch long deposition zone in a 13.25 inch diameter reactor tube). | | | | |
| 10 | 4 | 3 | 40 | 283 |
| 8 | 3 | 4 | 24 | 302 |
| 7 | 2 | 5 | 14 | 275 |
| 4 | 2 | 6 | 8 | 226 |
| 5 | 2 | 6 | 10 | 283 |
| B. Pancake-Flat round susceptor | | | | |
|  |  | 3 | 39 | 276 |
|  |  | 4 | 22 | 277 |
|  |  | 5 | 12 | 236 |
|  |  | 6 | 8 | 226 |
| C. Four sided reactor 9 | | | | |
|  |  | 6 | 12 | 340 |
|  |  | 8 | 4 | 201 |

The silicon epitaxial reactor 10 of this invention has a number of significant features. These include using a plural and preferably four-sided stationary susceptor 12 in the vertical mode. Gas is fed through the center of the susceptor 12. Gas distribution is through separate nozzles or tubes for each of the susceptor sides. a pyrolytic heat shield 26 inside susceptor 12 insulates against radiant heat from the susceptor to the gas inlet assembly. Susceptor 12 includes buttress shaped corners which form a gas flow channel for each face or susceptor 12. A low electrical resistance path is provided for the induction heating and consequently the corners are much cooler. Finally, a slightly shaped quartz reactor tube 9 conforms to the rectangular susceptor with an angled gas flow over each face.

Figure 6:
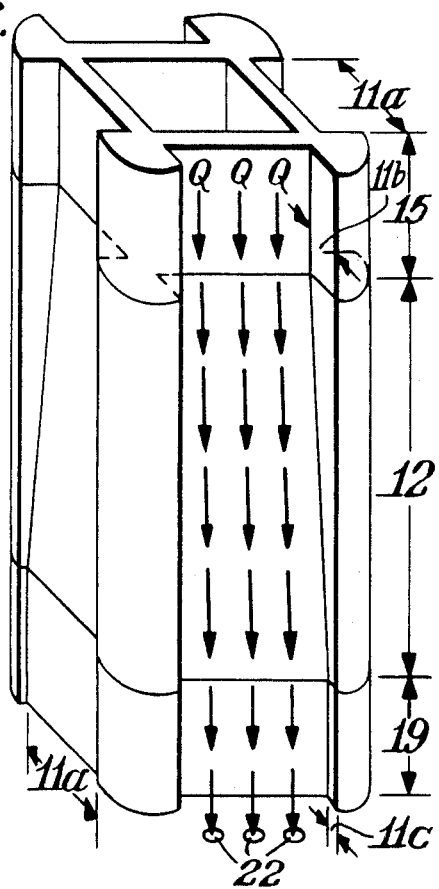
FIGS. 6 and 7 are perspective views of modified reactors in accordance with this invention.
Figure 7:
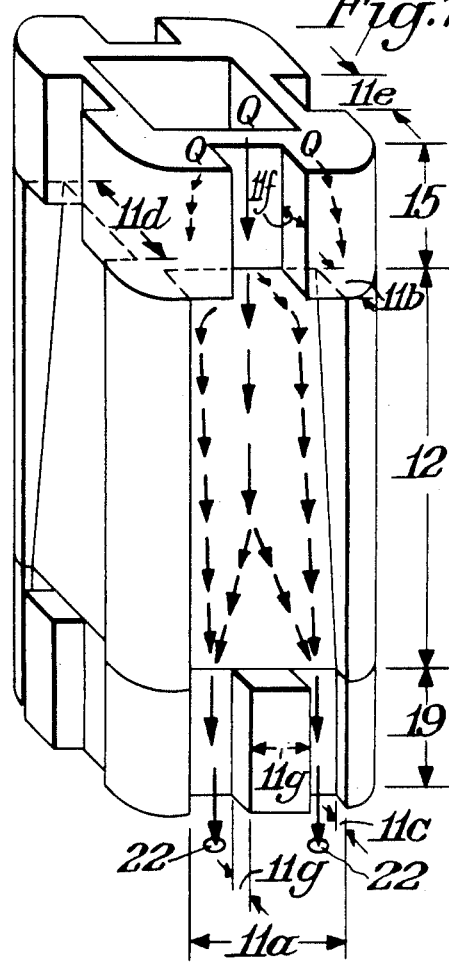

The above discussion and examples serve as a basis for other aspects of this invention relating to gas distributing technology for both stationary and rotating susceptors of four or more sides in barrel reactors. FIG. 6 shows the relationship between a truncated prymidal susceptor 12 with a matching gas flow path 11a multiplied by 11b on the straight pre-heater 15 and matching post-heater 19. As indicated in the prior discussion, if the quantity of chemical gas flow is nearly uniformally distributed through area 11a multiplied by 11b and if the exhaust holes 22 provide a nearly uniform flow from area 11a multiplied by 11b then it is expected that the deposited thickness on the left and right sides of the product wafers 14 will be thicker than it is at the center. Also, from the previous discussion of the new and novel reactor several ways of dealing with this problem were shown, e.g. spacing of the holes in item 18 to deliver more gas over the center portion of the wafers.

FIGS. 7, 8A, 8B and 8C show alternative approaches for varying the gas flow distribution across 11a and 11b of the susceptor, hence making the deposited thickness more uniform on the product wafers. Such approaches can be used with either ribbed, non-ribbed or conventional susceptors that are stationary or rotating. With respect to FIG. 7 it can be seen that the dimension 11e on the pre-heater 15 is less than dimension 11c on the susceptor 12. Since most of the reactor input gas Q will pass through the four slots with areas 11e multiplied by 11f. This produces the effect of inputting more gas over the central portion over the central portions of the wafers and less gas over the edges of the wafers. In this way more or less gas can be channeled where required. Similarly, by appropriately shaping the post-heater 19 the effect of gas channeling is reflected for some distances upstream and the thickness of the deposit on the wafers towards the bottom of the susceptor can be adjusted.

Figure 8A:
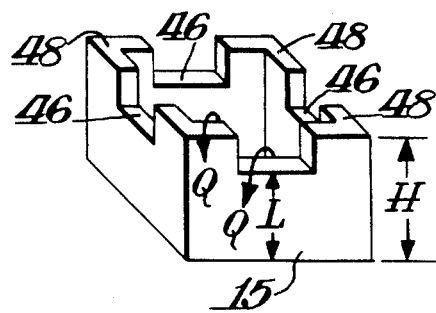
FIGS. 8A, 8B and 8C are perspective views of alternative pre-heater configurations in accordance with this invention
Figure 8B:
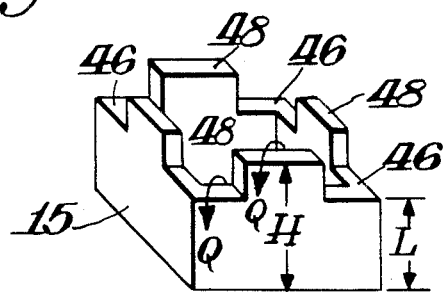
Figure 8C:
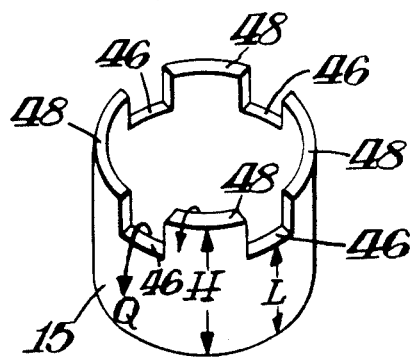

Other configurations of pre-heaters 15 that can be used to cause gas flow channeling for stationary or rotating susceptors are shown in FIGS. 8A, 8B and 8C. With respect to FIGS. 8A, 8B and 8C these designs provide easy gas channeling paths Q at the cutout sections 46 of lower elevations L and higher impedance gas paths 48 at higher elevations H. It should be noted that baffles (not shown) can be inserted into the interior of the pre-heaters 15 to cause the reactor input gases to mix and be directed toward the sections of low impedance gas paths 46 and away from areas 48 of high impedance gas paths. Also, a top plate can be provided over the pre-heaters to provide a roof-like structure.

Figure 9:
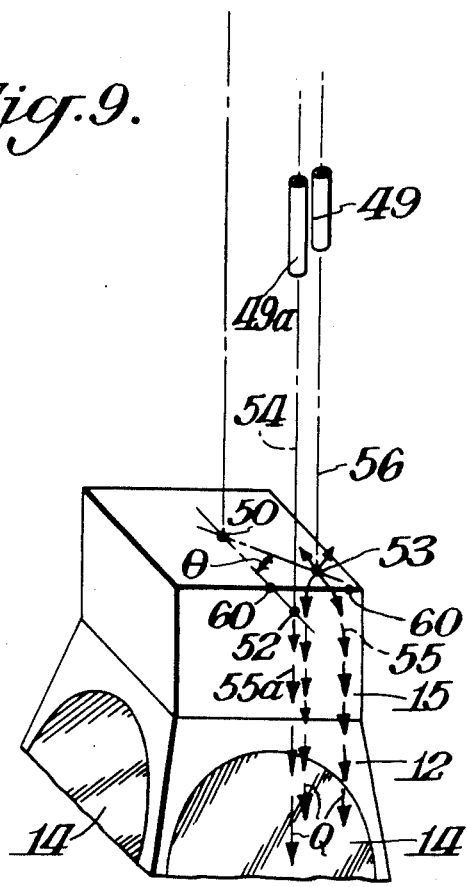
FIG. 9 is a perspective view showing the gas stream in a reactor in accordance with this invention.
Figure 10:
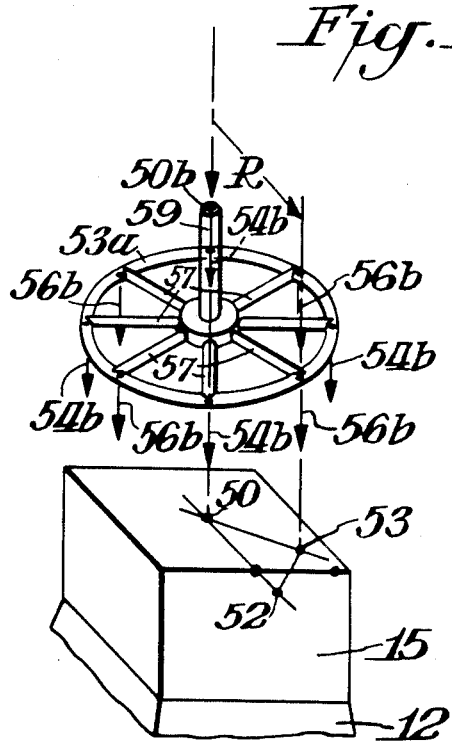
FIGS. 10 and 11 are perspective views of alternative distribution devices in accordance with this invention.
Figure 11:
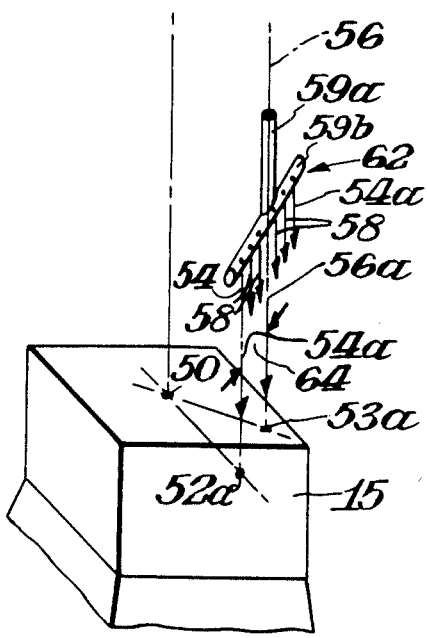

Another type of gas distributor configuration is shown in FIGS. 9, 10 and 11. With reference to FIG. 9, gas delivery tubes 49 and 49a are arranged to inject more gas over the central portion of the product wafers 14 and less over their edges. The tube 49 is positioned vertically so that the gas stream 56 impinges on the surface of the pre-heater 15 at a point 53 which is between the edge 60 and the center 50 and along a line that has a length equal to or greater than the shortest distance between the center of the pre-heater and its edge. In this way, the gas stream 56 is deflected into the spaces between the edges 60 and the interior of the reactor tube, so that a portion 55 flows to the right hand edge section of the wafer 14 and a portion 55a flows toward the center section of the wafer 14. The tube 49a is positioned vertically so that gas stream 54 is injected unimpeded through points 52 in the space between the edges 60 and the interior of the reactor tube wall. The gas stream 54 is a line to substantially pass over the central portion of the wafer 14. If the combination of the susceptor 12 and the pre-heater 15 is rotated about their common central longitudinal axis which passes through point 50 then only one gas delivery tube is needed. It can be seen that as the susceptor and pre-heater are rotated through an angle $\theta$ one tube can alternately deliver a gas stream 56 to point 53 and a gas stream 54 through point 52. In practice for most processes, it is preferably to simultaneously deposit everywhere on all of the product wafers on all susceptor faces. For this purpose, it is preferable to have a plurality of gas streams for each susceptor face and rotate the pre-heater and susceptor at one nominal velocity that is consistent with the deposition process. Further, if the susceptor is rotated in this manner it is not necessary for the gas flow streams to have equal quantities of flow and hence it is convenient to use gas flow distributors as shown in FIGS. 10 and 11.

FIG. 10 shows gas stream 56b and 54b eminating from corresponding holes in a hollow tubular ring 53. The ring is feed by radial tubular arms 57 which are connected to a common gas feed tube 59. If the center line 50b of the tube 59 is positioned above the pre-heater and is made to coincide with the central longitudinal center line of the rotating pre-heater and susceptor and if the radial distances R between 50b and 56b is made equal to the distance between points 50 and 53 in FIG. 9 then flow streams 56b will impinge on corresponding points on the pre-heater and streams 54b will flow through corresponding points 52. Although it is preferred to have a least one gas stream per susceptor face, the number of such gas streams and their spacing and size should be made compatible with the processs to obtain the best results.

FIG. 11 shows gas streams 54a, 58 and 56a flowing from corresponding holes in a tubular member 59b of a tee-like structure 62. The gas streams are fed from a common supply tube 59a. If tee 62 is positioned above the rotating pre-heater 15 and susceptor 12 so that the center line of the stream 56a is coincident with the center line of stream 56 and distant 64 is such that stream 54a is coincident with stream 50 then flow streams 54a will impinge on corresponding points 53 on the preheater and streams 54a will flow through corresponding points 52. Gas streams 58 exiting their corresponding holes in 59b will fall between points 52 and 53 in FIG. 9. The number, size and spacing of the gas streams can be varied for particular processes to obtain the best results. Although only one gas distributor 62 is required for rotating susceptors and pre-heaters, it is preferred that at least one distributor 62 is used per susceptor side. Also, it is possible to use separate controllable gas inputs to each distributor 62 for more control with rotating or straight susceptors and pre-heaters of four or more sides. Although FIGS. 10 and 11 illustrate two examples of gas flow distributors, it can be appreciated by those skilled in the art that others may be constructed within the scope of this invention. For example, with reference to FIG. 11, instead of inputting the gas to the top of item 59, the gas may be inputted from one or the other end of item 59b. Also, with reference to FIG. 10, it is possible to in a similar manner to holes 62 in FIG. 11. It is to be understood that the method of distributing gas flows shown in FIGS. 9, 10, and 11 can be used in combination with those shown in FIGS. 6, 7, 8a and 8c.

What is claimed is:

1. A reactor for producing epitaxial layers on semiconducting wafers by depositing a film on each wafer with the depositing resulting from a reaction gas contacting the wafer, comprising a hollow outer body, a multi-sided susceptor vertically mounted within said body, each side of said susceptor having a surface for supporting at least one wafer, each supporting surface having a central region extending vertically between edge regions, heating means for heating said susceptor, reaction gas supply means, reaction gas distributor means communicating with said gas supply means and for flowing the gas along each of said susceptor sides in a gas flow pattern having a different amount of gas flow down said central regions than the amount of gas flow down said edge region of each of said susceptor sides, said heating means heating the gas flowing along said susceptor sides to form a deposit of uniform thickness on each wafer, and outlet means for discharging the gas from said body.

2. The reactor of claim 1 wherein said susceptor has at least four sides.

3. The reactor of claim 2 wherein said susceptor has four sides.

4. The reactor of claim 1 wherein said susceptor is stationarily mounted.

5. The reactor of claim 1 wherein said susceptor is rotatably mounted.

6. The reactor of claim 1 wherein said gas distributor means feeds gas through the center of said susceptor.

7. The reactor of claim 1 wherein said hollow outer body is of round cross-section.

8. The reactor of claim 1 wherein said hollow outer body is of square cross-section.

9. The reactor of claim 2 wherein said sides are convex shaped.

10. The reactor of claim 6 including an elongated tubular heat shield mounted within said susceptor around said gas distributor means.

11. The reactor of claim 10 wherein said heat shield is of box-like structure with two sets parallel walls.

12. The reactor of claim 11 wherein said heat shield is pyrolytic graphite.

13. The reactor of claim 10 wherein said heat shield is of round tubular pyrolytic graphite structure.

14. The reactor of claim 1 wherein said susceptor is pyramidal shaped with inclined side walls diverging away from the top of said susceptor.

15. The reactor of claim 1 wherein said susceptor sides are in the form of recessed faces with buttressed corners forming flow channels having straight parallel edge walls between pairs of said corners.

16. The reactor of claim 15 wherein said gas distributor means comprises tubes extending completely through said susceptor, and each tube terminates in a nozzle outside of and at the upper portion of said susceptor.

17. The reactor of claim 16 including a cap above the susceptor, said cap having a downwardly extending peripheral rim disposed adjacent said nozzles to deflect the gas downwardly along said sides of said susceptor.

18. The reactor of claim 17 wherein each of said gas distribution tubes terminates in a tee section which forms said nozzle.

19. The reactor of claim 14 including a straight buttressed pre-heater.

20. The reactor of claim 14 including a sloped buttressed pre-heater.

21. The reactor of claim 15 including a straight buttressed post heater.

22. The reactor of claim 15 including a sloped buttressed post heater.

23. The reactor of claim 1 wherein said body comprises a quartz tube mounted on a plate, said susceptor being mounted on said plate, said gas distribution tubes extending through said plate, and said outlet means including a plurality of openings in said plate.

24. The reactor of claim 1 wherein said gas distributor means comprises tubes extending completely through said susceptor, and each tube terminates in a nozzle outside of and at the upper portion of said pre-heater.

25. The reactor of claim 24 wherein said nozzle terminates in a tee shape with a plurality of holes.

26. The reactor of claim 23 including a cap above said susceptor, and said cap having a downwardly extending peripheral rim disposed adjacent to said nozzles to direct the gas downwardly.

27. The reactor of claim 24 including a cap above said susceptor, said cap having a downwardly extending peripheral rim disposed adjacent said nozzles to direct the gas downwardly along said sides of said susceptor.

28. The reactor of claim 7 wherein said body has a reflective coating therearound except for at least one portion which comprises a vertical stripe.

29. The reactor of claim 8 wherein said body is of square cross-section, and a non-reflective vertical stripe being at each corner thereof.

30. The reactor of claim 9 wherein said body has a cross section with convex shaped sides, and a non-reflective strip at each corner.

31. The reactor of claim 25 wherein said body is of circular cross-section.

32. The reactor of claim 1 wherein said susceptor is of truncated pyramidal shape with buttressed corners extending vertically outwardly thereof to provide a sloped channel along each side thereof, said flow adjusting means comprising a straight pre-heater mounted on top of said susceptor and a straight post-heater mounted below said susceptor, said pre-heater and said post-heater having buttressed corners with planar faces therebetwen defining straight channels, said buttressed corners of said susceptor merging into and being vertically aligned with said buttress corners of said pre-heater and said post-heater, and said channels of said susceptor merging into said channels of said pre-heater and said post-heater.

33. The reactor of claim 1 wherein said susceptor is of truncated pyramidal shape with buttressed corners extending vertically outwardly thereof to provide a sloped channel along each side thereof, said flow adjusting means comprising a straight pre-heater mounted on said susceptor and a straight post-heater mounted below said susceptor, said pre-heater having buttressed corners overhanging said susceptor channels with pre-heater channels between its buttressed corners, said post-heater having buttressed corners aligned with and merging into said susceptor buttressed corners and with post-heater channels between its buttressed corners, all of said channels merging into each other, and vertical gas flow diverters in said post-heater channels.

34. The reactor of claim 1 wherein said heating means includes a pre-heater in the form of a hollow closed end member mounted on said susceptor and having a peripheral wall, with spaced cut-out portions extending downwardly into said peripheral wall.

35. The reactor of claim 34 wherein said pre-heater is of multi-sided cross-section, and said cut-out portions being midway between the corners thereof.

36. The reactor of claim 34 wherein said pre-heater is of square cross-section, and said cut-out portions being at the corners thereof.

37. The reactor of claim 34 wherein said pre-heater is of circular cross-section, and said cut-out portions being disposed to coinside with each susceptor face or corner.

38. The reactor of claim 34 wherein said pre-heater is of multi-sided cross-section, and said cut-off portions being at the corners thereof.

39. The reactor of claim 1 means including a pre-heater mounted on said susceptor, said pre-heater having a solid upper wall, and said gas distributor means feeding the gas for impingement against said upper wall.

40. The reactor of claim 1 wherein said gas distributor means includes a hollow horizontal discharge ring having a plurality of discharge openings directed toward said upper wall, a central vertical feed tube, and said central feed tube communicating with said ring through a plurality of radial tubes.

41. The reactor of claim 1 wherein said gas distributor means comprises a flow distributor tee in the form of a vertical supply tube communicating with an elongated horizontal tube, and said horizontal tube having a plurality of discharge openings directed downward toward the top of said upper pre-heater wall.

42. The reactor of claim 41 wherein said gas distributor means comprises more than one flow distributing tee.

43. The reactor of claim 1 wherein said gas distributor means is separately controlled to each susceptor side.

44. The reactor of claim 5 wherein said gas distribution means comprises a substantially vertical tube pointing downward and having a vertical longitudinal axis offset from the vertical longitudinal axis of said susceptor.

45. The reactor of claim 44 wherein said gas distributor comprises more than one substantially vertical tube.

46. The reactor of claim 1 including flow adjusting means a pre-heater in the form of a hollow closed end member with a solid upper wall mounted on said susceptor and having a peripheral wall with spaced cut out portions extending downwardly into said peripheral wall, and said gas distributor means feeding the gas for impingement against said upper wall.

47. The reactor of claim 46 wherein said distributor is at least one gas feed tube extending through said susceptor.

48. The reactor of claim 46 wherein said pre-heater is of a multi-sided cross section, and said cut out portions being midway between the corners thereof.

49. The reactor of claim 46 wherein said pre-heater is of multi-sided cross section, and said cut out portions being at the corners thereof.

50. The reactor of claim 46 wherein said pre-heater is of circular cross section and said cut out portions are disposed to coinside with susceptor faces or corners.

* * * * *